US009269827B2

(12) United States Patent
Kao et al.

(10) Patent No.: US 9,269,827 B2
(45) Date of Patent: Feb. 23, 2016

(54) OXIDIZING THE SOURCE AND DOPING THE DRAIN OF A THIN-FILM TRANSISTOR

(71) Applicant: CHUNGHWA PICTURE TUBES, LTD., Taoyuan (TW)

(72) Inventors: Chin-Tzu Kao, Changhua County (TW); Ya-Ju Lu, New Taipei (TW); Hsiang-Hsien Chung, Taoyuan County (TW); Wen-Cheng Lu, Taoyuan County (TW)

(73) Assignee: CHUNGHWA PICTURE TUBES, LTD., Taoyuan (TW)

( * ) Notice: Subject to any disclaimer, the term of this patent is extended or adjusted under 35 U.S.C. 154(b) by 0 days.

(21) Appl. No.: 14/472,401

(22) Filed: Aug. 29, 2014

(65) Prior Publication Data

US 2015/0372150 A1  Dec. 24, 2015

(30) Foreign Application Priority Data

Jun. 20, 2014  (TW) .............................. 103121414 A

(51) Int. Cl.
| | |
|---|---|
| *H01L 21/8234* | (2006.01) |
| *H01L 29/786* | (2006.01) |
| *H01L 29/66* | (2006.01) |
| *H01L 29/49* | (2006.01) |
| *H01L 21/467* | (2006.01) |
| *H01L 29/45* | (2006.01) |

(52) U.S. Cl.
CPC ........ *H01L 29/78696* (2013.01); *H01L 21/467* (2013.01); *H01L 21/823418* (2013.01); *H01L 29/45* (2013.01); *H01L 29/4908* (2013.01); *H01L 29/66969* (2013.01); *H01L 29/7869* (2013.01); *H01L 29/78606* (2013.01)

(58) Field of Classification Search
CPC ............ H01L 29/78696; H01L 21/467; H01L 21/823418; H01L 29/7869; H01L 29/66969; H01L 29/4908
See application file for complete search history.

(56) References Cited

U.S. PATENT DOCUMENTS

| | | | | |
|---|---|---|---|---|
| 2004/0086807 | A1* | 5/2004 | Peng | ................. H01L 29/66765 430/317 |
| 2005/0279999 | A1* | 12/2005 | Lee | ....................... H01L 51/105 257/66 |
| 2008/0012014 | A1* | 1/2008 | Park | ..................... H01L 51/0533 257/40 |
| 2010/0133530 | A1* | 6/2010 | Akimoto | ........... H01L 21/02554 257/43 |
| 2012/0097955 | A1 | 4/2012 | Wu et al. | |
| 2014/0038320 | A1* | 2/2014 | Wang | ..................... B82Y 20/00 438/22 |

FOREIGN PATENT DOCUMENTS

| | | |
|---|---|---|
| JP | 2005311377 A | 11/2005 |
| TW | 325601 | 1/1998 |

\* cited by examiner

*Primary Examiner* — Kevin Parendo
(74) *Attorney, Agent, or Firm* — CKC & Partners Co., Ltd.

(57) ABSTRACT

A method for manufacturing a thin-film transistor (TFT) is provided, including the following steps. A gate is formed on a substrate. A gate insulating layer is formed on the gate. A patterned semiconductor layer is formed on the gate insulating layer. A source is formed on the patterned semiconductor layer. The peripheral portion of the source is oxidized to form an oxide layer, wherein the oxide layer covers the source and a portion of the patterned semiconductor layer. A protective layer and hydrogen ions are formed, wherein the protective layer covers the oxide layer and the patterned semiconductor layer. The patterned semiconductor layer not covered by the oxide layer is doped with the hydrogen ions to form a drain. A TFT is also provided.

6 Claims, 6 Drawing Sheets

OXIDIZING THE SOURCE AND DOPING THE DRAIN OF A THIN-FILM TRANSISTOR

RELATED APPLICATIONS

This application claims priority to Taiwanese Application Serial Number 103121414, filed Jun. 20, 2014, which is herein incorporated by reference.

BACKGROUND

1. Field of Invention

The present invention relates to a thin-film transistor and method for manufacturing the same. More particularly, the present invention relates to a short-channel thin-film transistor and method for manufacturing the same.

2. Description of Related Art

As the progress in semiconductor manufacturing technology, the manufacturing process of thin-film transistor (TFT) is becoming faster and simpler. Accordingly, the TFT is widely used in computer chips, mobile chips, and TFT liquid crystal display (TFT-LCD), etc. When the TFT is applied in a LCD, the TFT can serve as a switch, and the images displayed by pixels of the LCD is controlled by the on/off state of the switch. The TFT switching speed between on and off states has to be fast. The switching speed relates to the on-current ($I_{on}$) of the TFT, and the enhancement of the $I_{on}$ increases the efficiency and the performance of the TFT. The $I_{on}$ relates to the ratio of the channel width (W) and channel length (L). The larger the ratio of the channel width and channel length (W/L) is, the larger the $I_{on}$ is. Therefore, shortening the channel length of the TFT facilitates the efficiency and the performance of the TFT.

However, the exposure machine applied in the process limits the current minimum line width and distance at about 3 μm, which is unable to be further shortened. The margin for increasing the $I_{on}$ of the TFT is therefore constrained, so as the efficiency and the performance of the TFT. How to make increase the efficiency and the performance of the TFT becomes an important issue.

SUMMARY

An objective of the present invention is to provide a thin-film transistor (TFT) and method for manufacturing the same, which can shorten the channel length of the TFT, and enhance the efficiency and the performance of the TFT effectively.

An aspect of the present invention provides a method for manufacturing a thin-film transistor, including the following steps. A gate is formed on a substrate. A gate insulating layer is formed on the gate. A patterned semiconductor layer is formed on the gate insulating layer. A source is formed on the patterned semiconductor layer. The peripheral portion of the source is oxidized to form an oxide layer, wherein the oxide layer covers the source and a portion of the patterned semiconductor layer. A protective layer and a plurality of hydrogen ions are formed, wherein the protective layer covers the oxide layer and the patterned semiconductor layer. The patterned semiconductor layer not covered by the oxide layer is doped with the hydrogen ions to form a drain.

According to one embodiment of the present invention, the step of forming the patterned semiconductor layer includes a semiconductor material is formed on the gate insulating layer. A photoresist is formed on the semiconductor material by a half-tone mask. The semiconductor material is etched using the photoresist as a shield to form the patterned semiconductor layer.

According to one embodiment of the present invention, the material of the source includes aluminum, molybdenum, or titanium.

According to one embodiment of the present invention, the step of oxidizing the peripheral portion of the source utilizes nitrogen dioxide plasma or oxygen plasma.

According to one embodiment of the present invention the protective layer and the hydrogen ions are formed by methylsilane ($SiH_4$) and ammonia ($NH_3$).

According to one embodiment of the present invention, the oxide layer has a thickness smaller than 3 μm.

Another aspect of the present invention provides a thin-film transistor, including a substrate, a gate on the substrate, a gate insulating layer on the gate, a structural layer on the gate insulating layer, including a semiconductor layer and a drain, which the semiconductor layer and the drain are adjacently connected, a source on a portion of the semiconductor layer, an oxide layer covering the source and the semiconductor layer not covered by the source, and a protective layer on the drain and the oxide layer. The oxide layer has a thickness smaller than 3 μm.

According to one embodiment of the present invention, the material of the semiconductor layer includes indium gallium zinc oxide (IGZO).

According to one embodiment of the present invention, the material of the oxide layer includes metal oxide.

According to one embodiment of the present invention, the material of the protective layer includes silicon nitride ($SiN_x$).

Advantage of the present invention is that by oxidizing the peripheral portion of the source to form the oxide layer, and by doping a portion of the patterned semiconductor layer with the hydrogen ions formed while forming the protective layer to form the drain, the channel length of the TFT can be shortened, and thus enhance the efficiency and the performance of the TFT.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
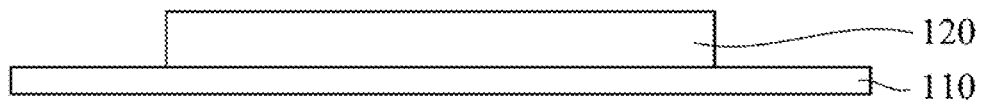
FIGS. 1A through 1C are schematic cross-sectional views of a conventional thin-film transistor at various manufacturing stages.
Figure 1B:
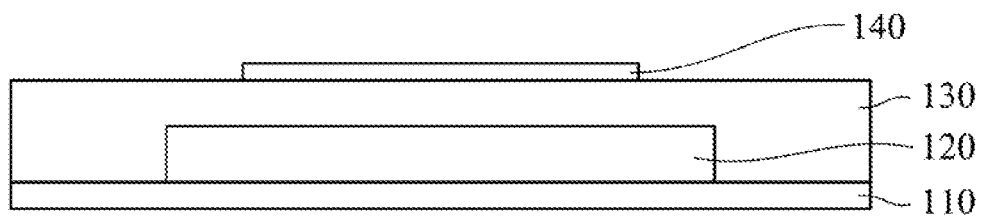
Figure 1C:
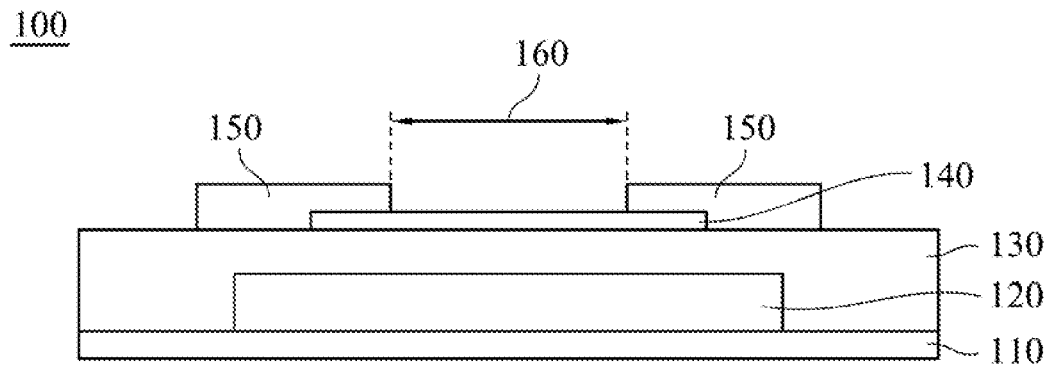

FIGS. 1A through 1C are schematic cross-sectional views of a conventional thin-film transistor (TFT) 100 at various manufacturing stages. Referring to FIG. 1A, a gate 120 is formed on a substrate 110. Then, as shown in FIG. 1B, a gate insulating layer 130 is formed on the gate 120, and a semiconductor layer 140 is formed on the gate insulating layer 130. FIG. 1C shows that source/drain regions 150 are on both sides of the semiconductor layer 140, wherein the region between the two source/drain regions 150 is a channel 160 of the TFT 100. The conventional method for manufacturing TFT is limited by the constraint on the exposure machine, and thus the current minimum channel length is about 3 μm, and cannot be further shortened. Accordingly, the margin for increasing the on-current ($I_{on}$) of the TFT is limited, and thus the efficiency of the TFT cannot be enhanced effectively.

Figure 2A:
FIGS. 2A through 2K are schematic cross-sectional views of a thin-film transistor at various manufacturing stages according to an embodiment of the present invention.
Figure 2B:
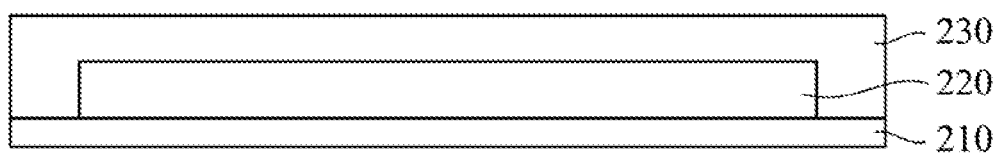

Therefore, an aspect of the present invention provides a method for manufacturing a thin-film transistor. FIGS. 2A through 2K are schematic cross-sectional views of a thin-film transistor 200 at various manufacturing stages according to an embodiment of the present invention. FIG. 2A shows that a gate 220 is formed on a substrate 210. Then, FIG. 2B shows that a gate insulating layer 230 is formed on the gate 220.

Figure 2C:
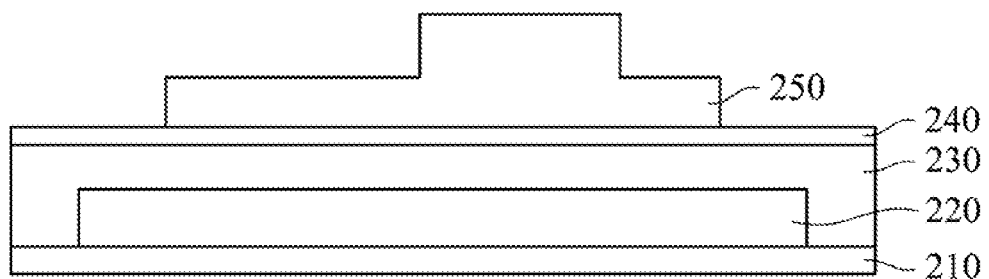
Figure 2D:
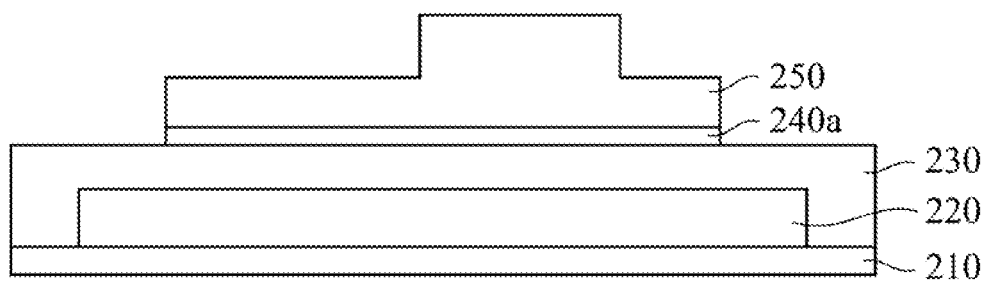
Figure 2E:
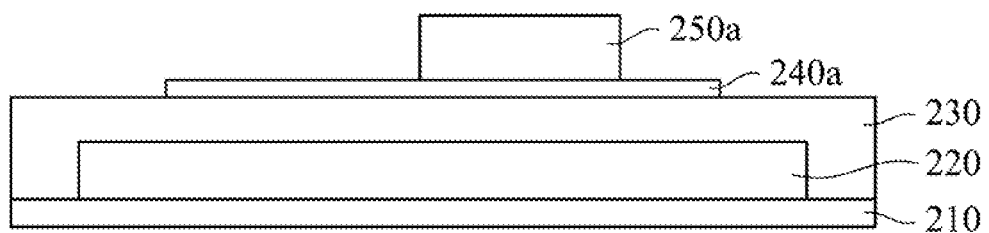

FIGS. 2C through 2E show a method for forming a patterned semiconductor layer 240a according to an embodiment of the present invention. FIG. 2C shows that a semiconductor material 240 is formed on the gate insulating layer 230, and a first photoresist 250 is formed on the semiconductor material 240 by a half-tone mask (not shown). Then, as shown in FIG. 2D, the semiconductor material 240 is etched using the first photoresist 250 as a shield to remove the semiconductor material 240 not covered by the first photoresist 250, and to form the patterned semiconductor layer 240a. FIG. 2E shows that the first photoresist 250 is partially removed to leave a second photoresist 250a. The method for removing the first photoresist 250 may be asking. Ashing is a process of turning most of the carbon and hydrogen in the material of photoresist into carbon dioxide, water, and ash, which can remove the photoresist that is not required.

A half-tone mask is to plat a layer of "semitransparent" film to control the ratio of light passed to achieve the effect of semi-exposure. After the exposure, three level of exposure can be created, including fully exposed, semi-exposed, and non-exposed, and thus photoresist with two kinds of thicknesses can be formed after development. The purpose of applying the half-tone mask for etching in the present invention is to expose the position for the subsequent formation of a source.

Figure 2F:
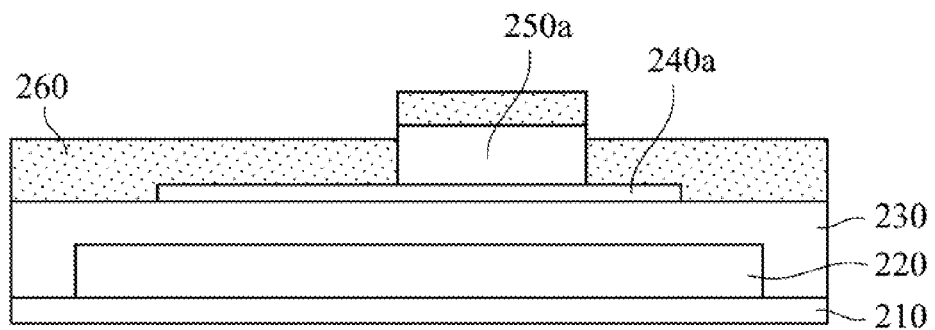
Figure 2G:
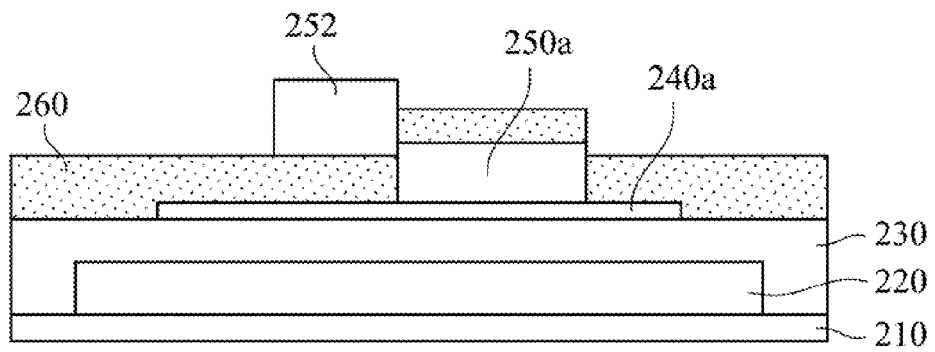
Figure 2H:
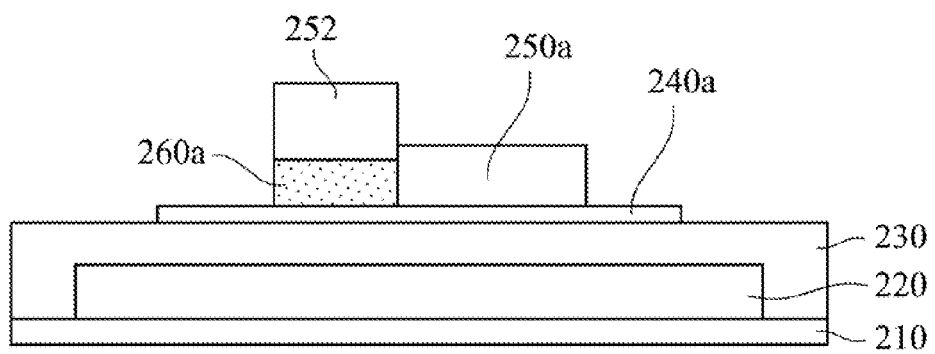
Figure 2I:
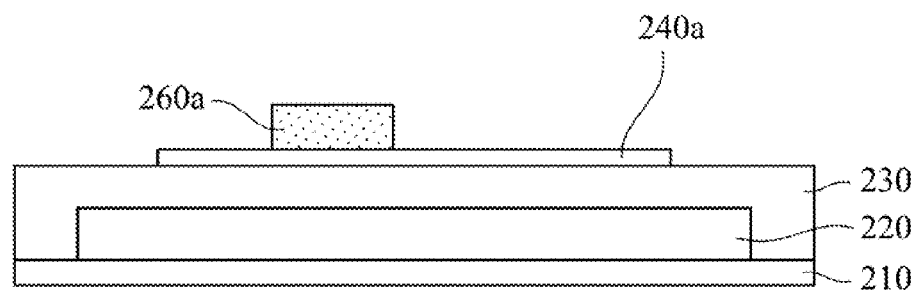

FIGS. 2F through 2I show a method for forming a source 260a according to an embodiment of the present invention. First, as shown in FIG. 2F, a source material 260 is formed on the gate insulating layer 230, the patterned semiconductor layer 240a, and the second photoresist 250a. Then, as shown in FIG. 2G, a third photoresist 252 is formed on the position for forming a source. FIG. 2H shows that the source material 260 is etched using the third photoresist 252 as a shield to form a source 260a. Next, as shown in FIG. 2I, the second photoresist 250a and the third photoresist 252 are removed simultaneously to expose the source 260a.

Figure 2J:
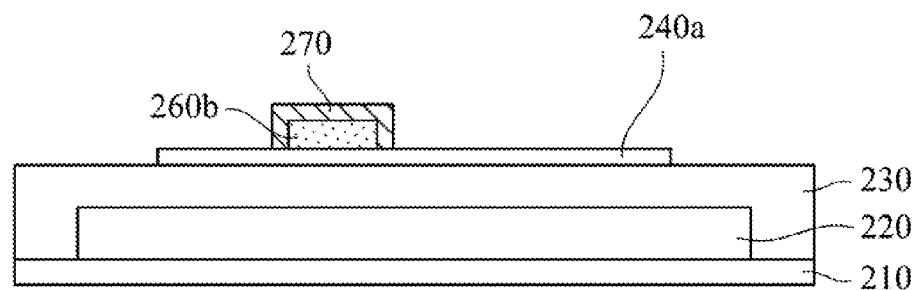

FIG. 2J shows a method for forming an oxide layer 270 according to an embodiment of the present invention. In FIG. 2J, the peripheral portion of the source 260a is oxidized to form an oxide layer 270, wherein the oxide layer 270 covers the source 260b that is not oxidized and a portion of the patterned semiconductor layer 240a.

The material of the source is metal that is easily oxidized, such as aluminum, molybdenum, and titanium. The method for oxidizing the peripheral portion of the source includes nitrogen dioxide plasma or oxygen plasma.

Figure 2K:
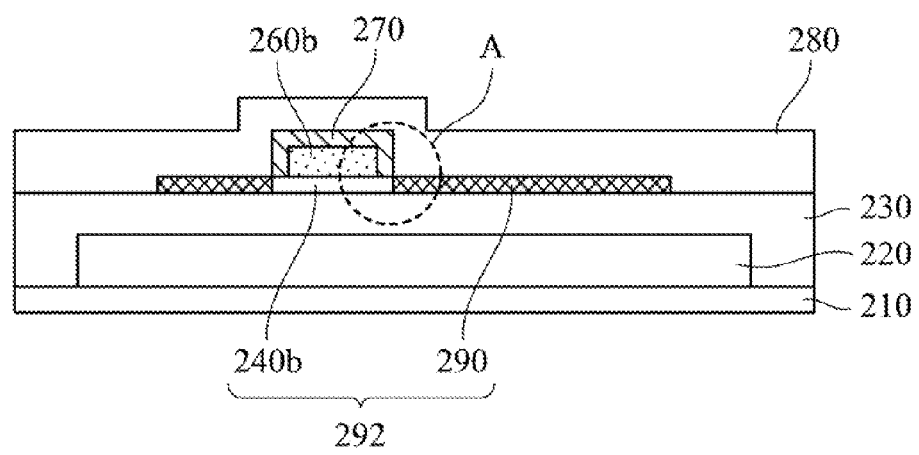

FIG. 2K shows a method for forming a protective layer 280 and a drain 290 according to an embodiment of the present invention. In FIG. 2K, a protective layer 280 and hydrogen ions (not shown) are formed, wherein the protective layer 280 covers the oxide layer 270 and the patterned semiconductor layer 240a. In one embodiment, the protective layer 280 is formed by methylsilane ($SiH_4$) and ammonia ($NH_3$), and thus a protective layer that the material is silicon nitride ($SiN_x$ protective layer) is formed, and hydrogen ions are produced. The patterned semiconductor layer 240a that is not covered by the oxide layer 270 is doped with the hydrogen ions to form a drain 290. The patterned semiconductor layer 240a that is not doped with the hydrogen ions will form a semiconductor layer 240b. It noteworthy that the drain 290 is formed by doping the patterned semiconductor layer 240a with the hydrogen ions, and thus both the drain 290 and the semiconductor layer 240b (i.e. the patterned semiconductor layer 240a not doped with the hydrogen ions) are located on the gate insulating layer 230, and are adjacently connected.

The material of the patterned semiconductor layer may be metal oxide semiconductor, such as indium gallium zinc oxide (IGZO). When the material is IGZO, a portion of the IGZO is doped with the hydrogen ions to form the drain with positive charges, and other portion of the IGZO, which is not doped with the hydrogen ions, will form the semiconductor layer.

It is noteworthy that one purpose of forming the oxide layer in the method of the present invention is to protect a portion of the patterned semiconductor layer (i.e. the patterned semiconductor layer covered by the oxide layer) from being doped with the hydrogen ions to form the drain in the subsequent step of forming the protective layer. Therefore, the oxide layer of the present invention can separate the source and the drain. The region between the source and the drain is the channel of the TFT, and thus the thickness of the oxide layer is the channel length of the TFT. When the peripheral portion of the source is oxidized by plasma, the channel length of the TFT may be controlled by the RF power and the treating time of plasma.

Moreover, it is well known in the relative art of the present invention that the source and the drain are capable of mutual substitution/interchangeable. Therefore, the source 260b (or 260a) of the present invention may be a drain, and the drain 290 of the present invention may be a source.

Figure 3:
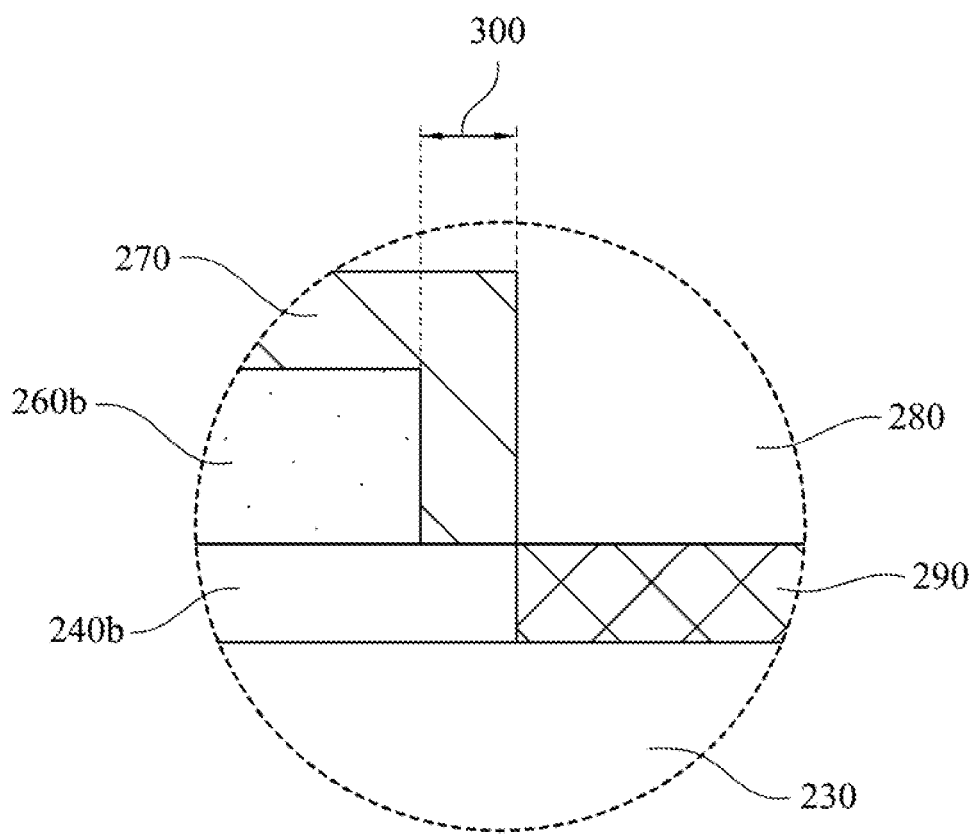
FIG. 3 is a partially enlarged view of FIG. 2K.

Another aspect of the present invention provides a thin-film transistor. Referring to FIG. 2K, it shows a schematic cross-sectional view of a thin-film transistor (TFT) 200 according to an embodiment of the present invention. The TFT 200 includes a substrate 210, a gate 220 on the substrate 210, a gate insulating layer 230 on the gate 220, a structural layer 292 on the gate insulating layer 230, the structural layer 292 includes a semiconductor layer 240b and a drain 290, which the semiconductor layer 240b and the drain 290 are adjacently connected, a source 260b on a portion of the semiconductor layer 240b, an oxide layer 270 covering the source 260b and the semiconductor layer 240b not covered by the source 260b, and a protective layer 280 on the drain 290 and the oxide layer 270. The oxide layer 270 has a thickness smaller than 3 µm. FIG. 3 shows a close up view A of FIG. 2K. The relative positions of the semiconductor layer 240b, the source 260b, the oxide layer 270, the drain 290, etc can be dearly known by FIG. 3. The region between the source 260b and the drain 290 is the channel 300 of the TFT 200. Therefore, the thickness of the oxide layer 270 is the length of the channel 300.

The material of the oxide layer is an oxide the material of the source used. In one embodiment, the material of the oxide layer includes metal oxide, such as aluminum oxide, molybdenum oxide, and titanium oxide.

The thin-film transistor and the method for manufacturing the same of the present invention apply the characteristic of metal oxidization. The oxide layer is formed by oxidizing the peripheral portion of the source, and the drain is formed by doping a portion of the patterned semiconductor layer with the hydrogen ions formed while forming the protective layer. Because the oxide layer can protect a portion of the patterned semiconductor layer from being doped with the hydrogen ions, the oxide layer can separate the source and the drain. Thereby, the limitation in the channel length of the TFT by the constraint on the exposure machine can be overcame, and the channel length of the TFT can be shortened with current equipment and processes. The TFT having channel length smaller than 3 µm can be manufactured thereby significantly increasing the on-current ($I_{on}$), and effectively enhancing the efficiency and the performance of the TFT.

It will be apparent to those ordinarily skilled in the art that various modifications and variations can be made to the structure of the present invention without departing from the scope or spirit of the invention. In view of the foregoing it is intended that the present invention cover modifications and variations of this invention provided they fail within the scope of the following claims.

What is claimed is:

1. A method for manufacturing a thin-film transistor, comprising the steps of:
   forming a gate on a substrate;
   forming a gate insulating layer on the gate;
   forming a patterned semiconductor layer on the gate insulating layer;
   forming a source on the patterned semiconductor layer;
   oxidizing the peripheral portion of the source to form an oxide layer, wherein the oxide layer covers the source and a portion of the patterned semiconductor layer;
   forming a protective layer and a plurality of hydrogen ions, wherein the protective layer covers the oxide layer and the patterned semiconductor layer; and
   doping the patterned semiconductor layer not covered by the oxide layer with the hydrogen ions to form a drain.

2. The method of claim 1, wherein the step of forming the patterned semiconductor layer comprises:
   forming a semiconductor material on the gate insulating layer;
   forming a photoresist on the semiconductor material by a half-tone mask; and
   etching the semiconductor material using the photoresist as a shield to form the patterned semiconductor layer.

3. The method of claim 1, wherein the material of the source comprises aluminum, molybdenum, or titanium.

4. The method of claim 1, wherein the step of oxidizing the peripheral portion of the source utilizes nitrogen dioxide plasma or oxygen plasma.

5. The method claim 1, wherein the protective layer and the hydrogen ions are formed by methylsilane ($SiH_4$) and ammonia ($NH_3$).

6. The method claim 1, wherein the oxide layer has a thickness smaller than 3 µm.

* * * * *